(12) United States Patent
Furuichi et al.

(10) Patent No.: US 9,078,384 B2
(45) Date of Patent: Jul. 7, 2015

(54) WIRING SUBSTRATE AND METHOD OF MANUFACTURING THE SAME

(75) Inventors: Jun Furuichi, Nagano (JP); Akihiko Tateiwa, Nagano (JP); Naoyuki Koizumi, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 692 days.

(21) Appl. No.: 13/417,665

(22) Filed: Mar. 12, 2012

(65) Prior Publication Data

US 2012/0234589 A1    Sep. 20, 2012

(30) Foreign Application Priority Data

Mar. 16, 2011  (JP) ................. 2011-058265

(51) Int. Cl.
*H05K 1/11* (2006.01)
*H05K 3/30* (2006.01)
(Continued)

(52) U.S. Cl.
CPC ......... *H05K 3/4682* (2013.01); *Y10T 29/49139* (2015.01); *H01L 2224/16225* (2013.01); *H01L 2224/73204* (2013.01); *H01L 2224/81193* (2013.01); *H01L 2924/09701* (2013.01); *H01L 2924/15311* (2013.01); *H01L 2924/19105* (2013.01); *H05K 3/205* (2013.01); *H05K 2201/10378* (2013.01); *H01L 2924/01019* (2013.01); *H01L 2924/01068* (2013.01);
(Continued)

(58) Field of Classification Search
CPC ............... H05K 2201/10378; H05K 1/182; H05K 1/183; H05K 1/185; H05K 3/4682; H05K 3/007; H05K 1/187

USPC ......... 174/250, 255, 260–267; 361/760, 761, 361/767
See application file for complete search history.

(56) References Cited

U.S. PATENT DOCUMENTS 6,687,985 B2 * 2/2004 Sakamoto et al. ............. 29/830
2005/0230841 A1 * 10/2005 Walk et al. .................... 257/778
(Continued)

FOREIGN PATENT DOCUMENTS

JP   2007-149731      6/2007
JP   2007149731 A  *  6/2007
(Continued)

OTHER PUBLICATIONS

Japanese Office Action dated Sep. 16, 2014, in the corresponding Japanese patent application No. 2011-058265, with English translation.

*Primary Examiner* — Hoa C Nguyen
*Assistant Examiner* — Amol Patel
(74) *Attorney, Agent, or Firm* — Kratz, Quintos & Hanson, LLP

(57) ABSTRACT

A wiring substrate includes a structure in which a plurality of wiring layers are stacked through insulating layers intervening therebetween, and which has a first surface side and a second surface side, the first surface side where a semiconductor element is to be mounted, the second surface side being located at an opposite side to the first surface side, an interposer buried in an outermost one of the insulating layers located at the first surface side, and electrically connected to the semiconductor element to be mounted, and a sheet-shaped member buried in an outermost one of the insulating layers located at the second surface side, wherein, the interposer and the sheet-shaped member are disposed at symmetrical positions symmetrical each other.

8 Claims, 16 Drawing Sheets

(51) Int. Cl.
*H05K 3/46* (2006.01)
*H01L 21/48* (2006.01)
*H05K 3/20* (2006.01)
*H01L 23/498* (2006.01)
*H01L 23/00* (2006.01)

(52) U.S. Cl.
CPC ..... *H01L23/49811* (2013.01); *H01L 23/49822* (2013.01); *H01L 21/4857* (2013.01); *H01L 24/16* (2013.01); *H01L 24/81* (2013.01); *H01L 2224/814* (2013.01); *H01L 2224/81801* (2013.01); *H01L 2924/15153* (2013.01); *H01L 2224/131* (2013.01); *H01L 2924/10253* (2013.01); *H01L 2924/07802* (2013.01)

(56) References Cited

U.S. PATENT DOCUMENTS

| | | |
|---|---|---|
| 2009/0135574 A1 | 5/2009 | Tanaka |
| 2009/0145636 A1* | 6/2009 | Miki et al. ............... 174/255 |
| 2010/0025081 A1* | 2/2010 | Arai et al. ............... 174/251 |
| 2010/0147560 A1 | 6/2010 | Kaneko |
| 2011/0010932 A1 | 1/2011 | Tanaka |

FOREIGN PATENT DOCUMENTS

| | | |
|---|---|---|
| JP | 2009-130104 A1 | 6/2009 |
| JP | 2010-141204 | 6/2010 |
| JP | 2010-239126 | 10/2010 |
| JP | 2010-239126 A1 | 10/2010 |

* cited by examiner

WIRING SUBSTRATE AND METHOD OF MANUFACTURING THE SAME

CROSS-REFERENCE TO RELATED APPLICATION

This application is based upon and claims the benefit of priority of the prior Japanese Patent Application No. 2011-58265, filed on Mar. 16, 2011, the entire contents of which are incorporated herein by reference.

FIELD

It is related to a wiring substrate and a method of manufacturing the same, and particularly is related to a wiring substrate that an interposer for mounting a semiconductor element is built-in and to a method of manufacturing the same.

Such a wiring substrate, since a semiconductor element is mounted thereon, will also be referred to as a "semiconductor package" or simply a "package" in the following description for the sake of convenience.

BACKGROUND

As a technique to manufacture a wiring substrate of a multilayer structure, a build-up method has heretofore been widely used. In recent years, in order to achieve a thinner wiring substrate, a wiring substrate having a structure without a core substrate (also called "coreless substrate") has been employed.

However, the thin substrate such as coreless substrate or the like as above is low in rigidity as a whole due to the absence of a core part and therefore has a problem that warpage is likely to occur. Warpage appears significantly especially when a semiconductor element (typically, a silicon chip) is mounted by performing reflow soldering for connecting the terminals between the chip and substrate, and when the underfill resin is filled under the semiconductor element, and also when the secondary mounting is performed, that is, the substrate equipped with the chip is mounted onto a motherboard or the like by performing reflow soldering. This is because a considerable amount of heat is applied to the substrate when these processes are performed.

On the other hand, due to increase in integration density of semiconductor element and improvement in functionality thereof, the wiring substrate for mounting the semiconductor element has been required to have finer and denser wirings accordingly. An organic resin is mainly used as the base material of such a wiring substrate. However, a substrate using an organic resin does not have a flat surface and thus has a limitation to make the wiring respond to the finer fabrication.

To solve this, a structure in which a semiconductor element is mounted on a wiring substrate through a silicon interposer which is capable of the finer fabrication, has been proposed.

As the technique related to such a conventional technique, as described in Patent Document 1 (Japanese Laid-open Patent Publication No. 2009-130104), for example, there is a substrate structure in which an interposer is connected to a coreless substrate through vias. As another technique, as described in Patent Document 2 (Japanese Laid-open Patent Publication No. 2010-239126), also there is a structure in which an interposer is incorporated in a coreless substrate.

As mentioned above, the thin substrate such as conventional coreless substrate, or the like is low in rigidity as a whole and therefore has the problem that warpage is likely to occur when a semiconductor element is mounted thereon, or the like. To solve this, various measures have heretofore been taken.

However, the elastic modulus and coefficient of thermal expansion (CTE) as a whole of the wiring substrate having an organic resin as its base material, are far different from the elastic modulus and CTE of a semiconductor element (whose base material is silicon) mounted thereon. Thus, it is a present condition that a sufficient measure can not be taken against the warpage.

SUMMARY

According to one aspect of the invention, there is provided a wiring substrate, which includes, a structure in which a plurality of wiring layers are stacked through insulating layers intervening therebetween, and which has a first surface side and a second surface side, the first surface side where a semiconductor element is to be mounted, the second surface side being located at an opposite side to the first surface side, an interposer buried in an outermost one of the insulating layers located at the first surface side, and electrically connected to the semiconductor element to be mounted, and a sheet-shaped member buried in an outermost one of the insulating layers located at the second surface side, wherein, the interposer and the sheet-shaped member are disposed at symmetrical positions each other.

According to another aspect of the invention, there is provided a method of manufacturing a wiring substrate, which includes, mounting an interposer on a support base material, forming an insulating layer covering the interposer, on the support base material, forming a via hole in the insulating layer and forming a wiring layer on the insulating layer, the wiring layer which is electrically connected to the interposer through the via hole, stacking a insulating layer and a wiring layer alternately, stacking a sheet-shaped member having an opening portion, on the stacked insulating layer, forming an insulating layer covering the sheet-shaped member having the opening portion, thereby burying the sheet-shaped member by the insulating layer, forming a via hole in the burying insulating layer according to a position of the opening portion of the sheet-shaped member, and forming an outermost wiring layer electrically connected to the underlying wiring layer through the via hole, on the burying insulating layer, and removing the support base material.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, preferred embodiments of the present invention will be described with reference to the accompanying drawings.

(First Embodiment . . . See FIGS. 1 to 12D and FIG. 18)

Figure 1:
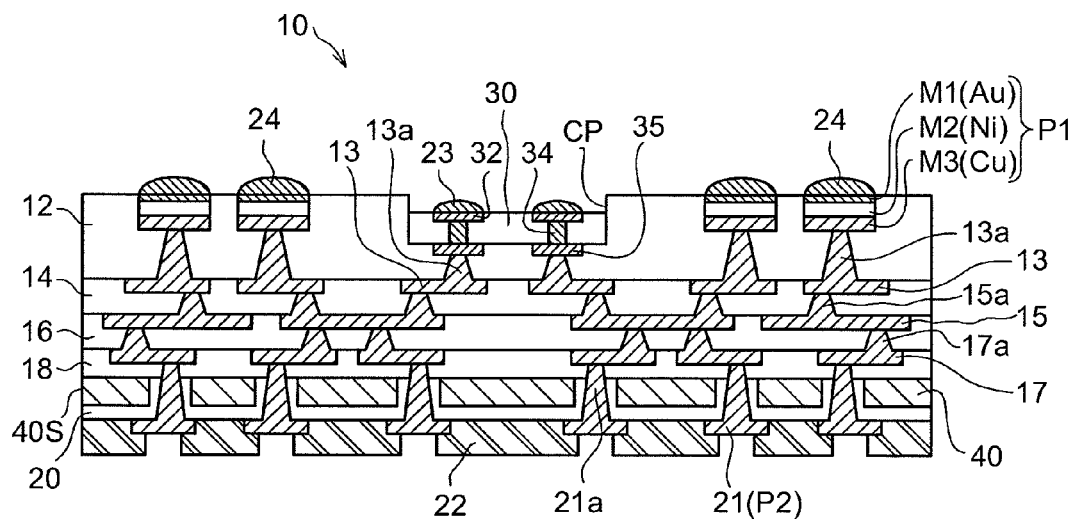
FIG. 1 is a cross-sectional view depicting configuration of a wiring substrate (semiconductor package) according to a first embodiment.

FIG. 1 depicts the configuration of a wiring substrate (semiconductor package) according to a first embodiment in cross section.

The wiring substrate (package) 10 of this embodiment has a structure in which a plurality of wiring layers 13, 15, 17, and 21 are stacked through insulating layers (specifically, resin layers) 12, 14, 16, 18, and 20, and are interlayer-connected to each other through conductors (vias 13a, 15a, 17a, and 21a) filled in via holes respectively formed in the insulating layers. In other words, the wiring substrate 10 is not a typical build-up multiplayer wiring board (in which build-up layers are stacked sequentially on both surfaces of a core substrate), but is in the form of a "coreless substrate" including no core base material.

As the material of each of the insulating layers 12, 14, 16, 18, and 20, an organic resin widely used as a build-up resin, such as an epoxy-based resin, a polyimide-based resin, or a phenol resin, is used. Moreover, as the material of each of the wiring layers 13, 15, 17, and 21, copper (Cu) is typically used.

A concave portion CP is provided in a center part of the outermost insulating layer 12 (specifically, a resin layer) of the wiring substrate (package) 10 at a first surface side thereof (an upper side in the example of FIG. 1: the side at which an interposer 30 is placed). The interposer 30 is mounted (buried) in the concave portion CP. When viewing the concave portion CP with the planer view, the concave portion CP is formed with, for example, a rectangular shape according to the external form of the interposer 30 to be mounted therein. As will be described later, a semiconductor element (chip) is mounted on the interposer 30.

In this embodiment, an inorganic material (specifically, silicon) is used as the base material of the interposer 30 in order to achieve fine wirings. And a semiconductor element (chip) which likewise has silicon as its base material, is mounted on the wiring substrate 10 which has an organic resin as its base material through the interposer 30. In this way, pads formed in the chip at a fine pitch can be easily pitch-converted by means of the interpose 30 on which the rewirings are formed. Besides silicon, an inorganic material such as a ceramic material or silica glass may be used as the base material of the interposer 30. A specific structure of the interposer 30 and a manufacturing method thereof will be described later.

Figure 9A:
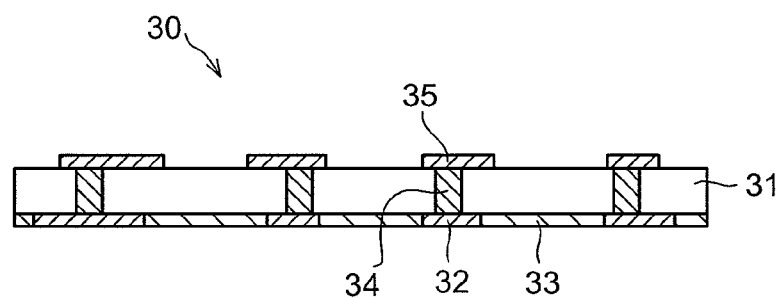
FIGS. 9A and 9B are cross-sectional views depicting processing steps to provide a supplemental explanation of the process performed in the step of FIG. 5A.
Figure 9B:
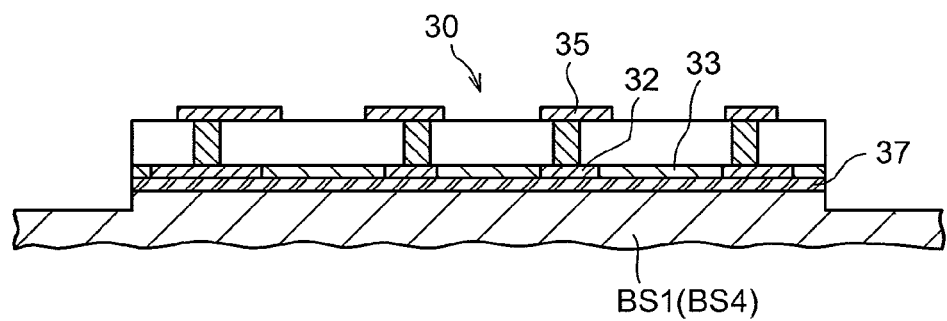

Electrode pads 32 and 35 are provided in both surfaces of the interposer 30. The pads 32 at a first surface side of the interposer 30 (an upper side in the example of FIG. 1: the side at which the semiconductor element is placed) are exposed at the surface of the interposer 30. Specifically, the pads 32 are exposed in the identical surface with the surface of a passivation film 33 as illustrated in FIGS. 9A and 9B. On the other hand, the pads 35 at a second surface side of the interposer 30 (a lower side in the example of FIG. 1: the opposite side of the interposer 30 to the first surface side thereof) are provided to protrude from the surface of the interposer 30 at the second surface side. The pads 35 are directly connected to the vias 13a formed in the outermost insulating layer 12 of the wiring substrate 10.

Moreover, in the outermost insulating layer 12, a plurality of pads P1 (first external connection pads) are arranged in a region around the concave portion CP (first concave portion: the concave portion in which the interposer 30 is mounted). Each pad P1 is arranged peripherally in a plan view of the wiring substrate 10, and is provided to be exposed in the identical surface with the surface of the wiring substrate 10 as depicted in FIG. 1. The pad P1 has a three-layer structure in which a copper (Cu) layer M3, a nickel (Ni) layer M2, and a gold (Au) layer M1 are stacked in this order from the bottom, for example.

Electrode pads of a semiconductor element can be connected to the pads 32 provided to the first surface side of the interposer 30 through solder bumps or the like. On the other hand, electrode terminals of passive elements such as chip capacitors can be connected to the pads P1 arranged around the interposer 30 through solders or the like. Thus, in order to make the connection easier, solders 23 and 24 of adequate amounts are deposited on the pads 32 and P1 in advance. Such precoating (solder deposition) is effective in view of maintaining wettability for a long time, and in view of preventing copper (Cu) oxidation of the pads 32 on the interposer 30 especially.

However, the precoating does not necessarily have to be performed. The pads 32 and P1 may be left exposed so that the electrode terminals of the semiconductor element and passive elements or the like can be connected thereto later when necessary. In this case, it is desirable to perform a suitable surface treatment (such as Ni/Au plating) on the surface of each pad 32 of the interposer 30.

Meanwhile, a solder resist layer 22 as a protection film is provided at the second surface side of the wiring substrate 10 (a lower side in the example of FIG. 1: the opposite side of the wiring substrate 10 to the first surface side thereof). The solder resist layer 22 is formed in such a way as to expose but partially cover pads P2 (second external connection pads) defined in desired positions in the outermost wiring layer (the wiring layer 21 in the example of FIG. 1). The pads P2 exposed from the solder resist layer 22 are connected to the pads 35 of the interposer 30 and the pads P1 for mounting passive elements through the vias 21a, the wiring layer 17 (vias 17a), the wiring layer 15 (vias 15a), and the wiring layer 13 (vias 13a).

External connection terminals such as solder balls used in mounting the wiring substrate 10 onto a motherboard or the like can be joined to the pads P2 exposed from the solder resist layer 22. Thus, in order to achieve a good contact in the joining, it is desirable to perform a suitable surface treatment (such as Ni/Au plating) on the pads P2.

Further, a sheet-shaped member 40 is buried in the outermost insulating layer 20 of the second surface side of the wiring substrate 10. The sheet-shaped member 40 is provided such that the distribution of the elastic modulus and the coefficient of thermal expansion (CTE) becomes substantially symmetrical system, in the vertical direction (the direction perpendicular to the substrate surface) after a semiconductor element is mounted on the interposer 30 buried in the wiring substrate. In other words, the sheet-shaped member 40 functions to adjust the distribution of each of the elastic modulus and the CTE and to alleviate warpage of the whole device (reduce the amount of warpage), in the vertical direction in a state where a chip is mounted (e.g. a semiconductor device 50 in FIG. 2).

For this reason, As the sheet-shaped member 40, it is desirable to use a material having a relatively high elastic modulus which is at the same level as the elastic modulus (approximately 193 GPa) of a semiconductor element (specifically, silicon chip) to be mounted on the wiring substrate 10, and a relatively low CTE which is at the same level as the CTE (approximately 3 ppm/K) of the semiconductor element. By this matter, the difference in CTE between the semiconductor element and the wiring substrate 10 is made small, thereby suppressing warpage of the semiconductor device.

Note that, the level of the warpage suppression varies to some extent depending upon the size of the wiring substrate 10 and the number of stacked layers therein, the constituent material and the size of the interposer 30, the arranged position and the size of the sheet-shaped member 40, and the like. In this embodiment, it is the assumption that the size (amount) of warpage allowable under any condition at a temperature ranging from room temperature (25° C.) to a reflow temperature range (around 230 to 260° C.) is suppressed to the value which is equal to or below 100 μm, for example. Accordingly, a material having an elastic modulus within a range larger than 130 GPa but not larger than 500 GPa and having a CTE within a range not larger than 10 ppm ($10 \times 10^{-6}$)/K is selected.

Thus, as the material of the sheet-shaped member 40, any material can be used regardless of whether it is a metallic material or a non-metallic material, as long as the elastic modulus and the CTE are within their respective ranges described above.

For example, as the metallic material, it is possible to use a 42 alloy (42 WT % nickel (Ni)-iron (Fe) alloy), a 36 alloy, Kovar (an alloy containing Fe: 53%, Ni: 28%, and cobalt (Co): 18%), or the like. As the non-metallic material, it is possible to use a carbon fiber cloth, a ceramic material, silica glass, or the like. Alternatively, it may use the same material as the material of the interposer 30, for example, there is silicon as the material.

Note that, in a case of using such a metallic material for the sheet-shaped member 40, when exposing a sidewall portion 40S of the sheet-shaped member 40 at the side surface of the wiring substrate 10 as depicted in FIG. 1, it is possible to cause adverse effects such as oxidation of the sidewall portion 40S. Thus, to securely avoid such troubles, a wiring substrate 10b (see FIG. 18) may be formed such that the sidewall portion 40S of the sheet-shaped member 40 is covered with the outermost insulating layer 20 in order to prevent the exposure of the sidewall portion 40S.

Specific materials, sizes, thicknesses, and the like of the members constituting the package (wiring substrate 10) will be described when necessary together with the steps in processes to be described later in detail.

Figure 2:
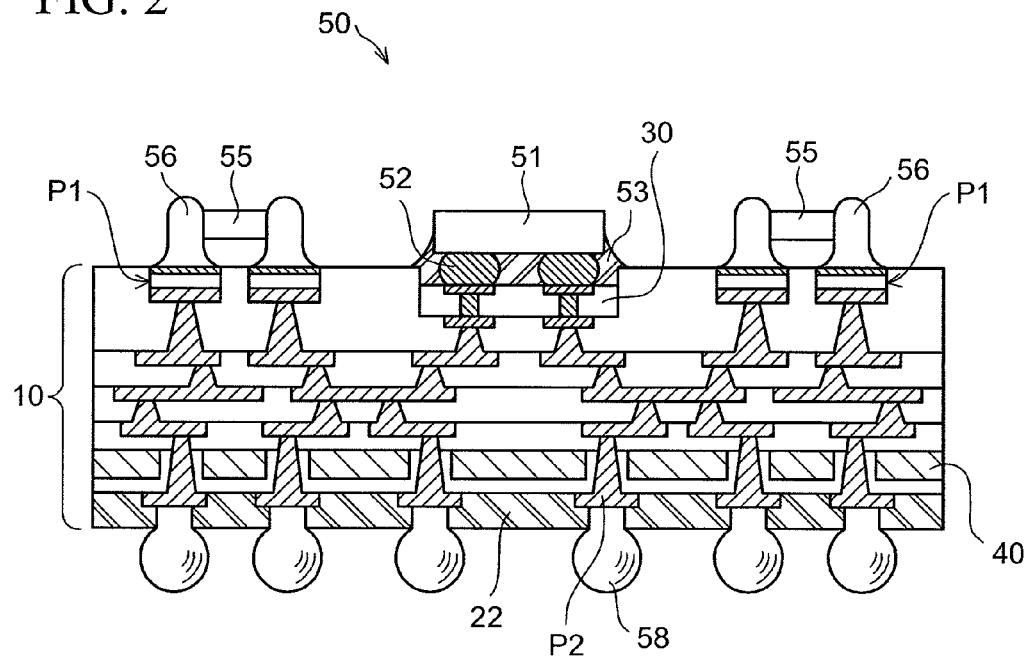
FIG. 2 is a cross-sectional view depicting an exemplary configuration (semiconductor device) in the case that a semiconductor element or the like is mounted on the wiring substrate in FIG. 1.

FIG. 2 depicts an exemplary configuration (semiconductor device) in the cross section in the case that a semiconductor element or the like is mounted on the wiring substrate 10 of this embodiment.

In the semiconductor device 50 depicted in FIG. 2, a semiconductor element 51 as an active element (e.g. a silicon chip such as a CPU) and chip capacitors 55 as passive elements are mounted on the first surface side of the wiring substrate 10. Moreover, solder balls 58 as external connection terminals are joined to the second surface side of the wiring substrate 10.

In the semiconductor device 51 mounted on the first surface side of the wiring substrate 10, its electrode pads (terminals) are electrically connected to the corresponding pads 32 (see FIG. 1) of the interposer 30 through conductive materials such as the solder bumps 52 or the like (e.g. flip-chip mounting). Further, an underfill resin 53 (such as an epoxy-based thermosetting resin) is filled in a gap between the mounted chip 51 and the interposer 30 (wiring substrate 10) and is cured, so that the chip 51 is fixed to the wiring substrate 10.

In the chip capacitors 55, its paired electrode terminals are connected to the pads P1 through conductive materials such as solders 56 or the like. Although the pads P1 are utilized as where the chip capacitors are mounted in this embodiment, the pads P1 may be utilized as where passive elements other than chip capacitors (such as resistive elements or chip inductors, or the like) are mounted. Moreover, if necessary, the pads P1 can be utilized as connection pads P1 in POP (a package-on-package) structure in which the wiring substrate 10 and another wiring substrate are stacked in the vertical direction (see FIG. 14).

Meanwhile, the solder balls 58 to be used in mounting the wiring substrate 10 onto a mounting substrate such as a motherboard are joined to the pads P2 exposed from the solder resist layer 22 in the second surface side of the wiring substrate 10. Although the example of FIG. 2 depicts BGA (Ball Grid Array) in which the solder balls 58 are joined, instead of it, PGA (Pin Grid Array) in which metal pins are joined to the pad P2 may be employed. Alternatively, the external connection terminals (solder balls or metal pins or the like) may not be provided, and the pads P2 themselves may be utilized as external connection terminals.

Next, a method of manufacturing the wiring substrate 10 of this embodiment will be described with reference to FIGS. 3A to 8C depicting an example of manufacturing steps therein.

First of all, in the first step (see FIG. 3A), a temporary substrate (support base material) BS which serves as a base is prepared. As described later, the support base material BS is etched in the final step. With this taken into consideration, a metal which can be dissolved by etchant (e.g. copper (Cu)) is used as the material of the support base material BS. As for the form of the support base material BS, a metal plate or a metal foil is basically enough. To give a specific example, one as disclosed in "method of manufacturing wiring substrate and method of manufacturing electronic component mounting structure" (Japanese Laid-open Patent Publication No. 2007-158174), which has been proposed by the applicant of the present application, may be used. Specifically, as the support base material BS, a structure can be preferably used which is obtained by disposing underlying layers and copper foils on a prepreg and heating and pressurizing them. Here, the prepreg is an adhesive sheet which is obtained by impregnating a glass cloth which is a reinforcing material, with a thermosetting resin such as an epoxy-based resin or a polyimide-based resin or the like, and which is made to a semi-cured state (B-stage).

In the next step (see FIG. 3B), a plating resist (resist layer) PR1 is formed on the support base material BS by using a patterning material. As the patterning material, it is possible to use a photosensitive dry film (one having a structure in which a resist material is sandwiched between a polyester cover sheet and a polyethylene separator sheet), a liquid photoresist (a liquid resist of a novolac-based resin, an epoxy-based resin, or the like), or the like. In a case of using the dry film, the surface of the support base material BS is cleaned, and thereafter the dry film is laminated by thermocompression bonding, for example.

In the next step (see FIG. 3C), the resist layer PR1 is patterned in a desired shape. Specifically, the resist layer PR1 is patterned to have an opening portion OP1 according to the external form (e.g. rectangular shape) when viewing the interposer 30 to be mounted inside the concave portion CP (FIG. 1) with the planer view For example, in a case of laminating a dry film as the resist layer PR1, the dry film is cured by ultraviolet (UV) irradiation exposure using a mask patterned in a desired shape. Further, the corresponding part is etched and removed by using a predetermined developer (the formation of the opening portion OP1), whereby the resist layer PR1 is formed. In a case of using a liquid photoresist too, the resist layer PR1 can be formed by performing the same step.

In the next step (see FIG. 3D), a plating film (Cu) MP having a thickness corresponding to the thickness of the resist layer PR1 is formed on a part of the support base material (Cu) BS exposed from the opening portion OP1 in the resist layer PR1 by means of electrolytic Cu plating utilizing the support base material BS as a power supply layer.

In the next step (see FIG. 3E), the resist layer PR1 having been used as a plating resist is removed. For example, in a case of using a dry film as the plating resist, the dry film can be removed by using an alkaline liquid agent such as a sodium hydroxide liquid agent or a monoethanolamine-based liquid agent. In a case of using a liquid resist of a novolac-based resin or an epoxy-based resin, the liquid resist can be removed by using acetone, an alcohol, or the like. As a result, a structure (convex support base material BS1) in which the plating film (Cu) MP is provided integrally on the support base material (Cu) BS is obtained.

Figure 3A:
FIGS. 3A to 3E are cross-sectional views depicting an example of steps (No. 1) for manufacturing the wiring substrate in FIG. 1.
Figure 3B:
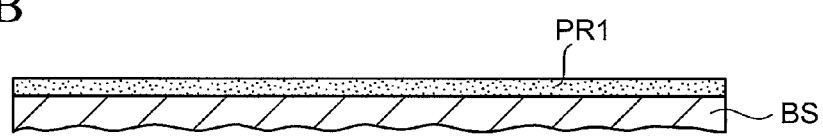

In the next step (see FIG. 4A), like the process performed in the step of FIG. 3B, by using a patterning material, a plating resist (resist layer) PR2 is formed on the surface of the support base material BS1 at which the convex portion (plating film MP) is formed. For example, a dry film is laminated. The thickness of the resist layer PR2 is selected to the thickness in which at least the convex portion (plating film MP) of the support base material BS1 is covered with the resist layer PR2 and which is equal to the thicknesses of pads P1 to be formed.

Figure 3C:
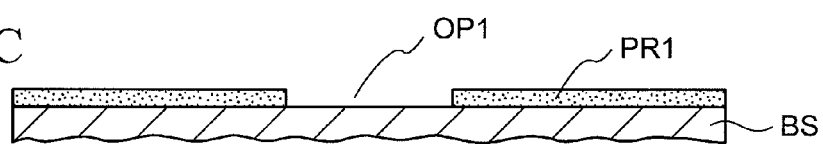

In the next step (see FIG. 4B), like the process performed in the step of FIG. 3C, the plating resist PR2 is patterned in a desired shape. In this case, the plating resist PR2 is patterned to have opening portions OP2 according to the shapes (e.g. circular shapes, rectangular shapes, or the like) of the pads P1 to be formed.

In the next step (see FIG. 4C), the pads P1 (first external connection pads) for mounting the passive element (the chip capacitor or the like) or for providing POP connection are formed on parts of the support base material (Cu) BS1 exposed from the opening portions OP2 in the resist layer PR2 by means of electrolytic plating utilizing the support base material BS1 as a power supply layer. For example, Au flash plating is performed on the support base material (Cu) BS1 (forming the Au layer M1), further Ni plating is performed on the Au layer M1 (forming the Ni layer M2), furthermore Cu plating is performed on the Ni layer M2 (forming the Cu layer M3), thereby the pads P1 each having a three-layer structure (Au/Ni/Cu) are formed. In this layer configuration, the Ni layer M2 functions as a barrier layer to prevent that the Cu contained in the overlying Cu layer M3 diffuses into the underlying Au layer M1.

Figure 4A:
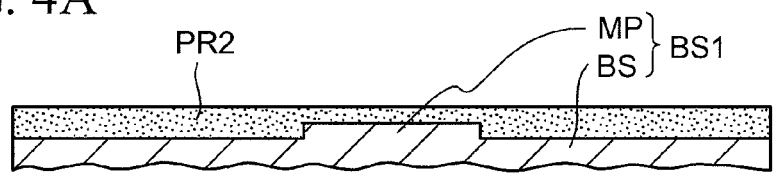
FIGS. 4A to 4D are cross-sectional views depicting manufacturing steps (No. 2) subsequent to the steps of FIGS. 3A to 3E.
Figure 4B:
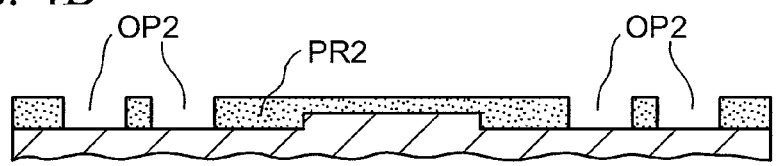
Figure 4C:
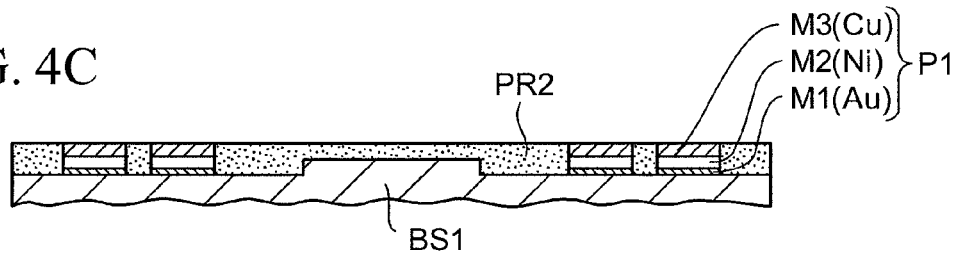

Although the pads P1 having the three-layer structure (Au/Ni/Cu) are formed in the example of FIG. 4C, the composition of the metal layers constituting each pad P1 is not limited to this example, as a matter of course. As an alternative layer configuration, the stacked layers may include Au/Pd/Ni/Cu, Au/Cu, or the like, for example. In short, it is only necessary that, the metal layer in contact with the support base material BS1 out of the metal layers constituting the pad P1, is made of a metal which cannot be dissolved by an etchant used to etch the support base material (Cu) BS1 in the final step. Besides Au, silver (Ag), iron (Fe), titanium (Ti), or the like can be used, for example.

Figure 3D:
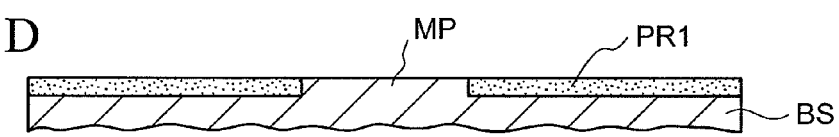
Figure 3E:
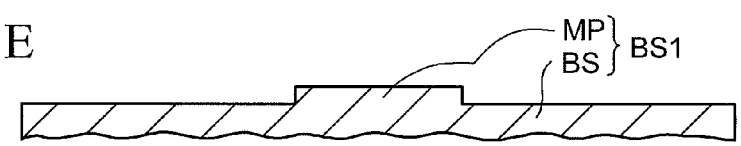

In the next step (see FIG. 4D), like the process performed in the step of FIG. 3E, the resist layer PR2 used as a plating resist is removed. As a result, a structure in which the pads P1 are formed on the support base material BS1 is obtained.

In the next step (see FIG. 5A), the interposer 30 prepared in advance is mounted on the convex portion (plating film MP) of the support base material BS1.

The structure of the interposer 30 and a method of mounting the interposer 30 will be further described with reference to FIGS. 9A and 9B. FIG. 9A depicts the cross-sectional structure of the interposer 30. The interposer 30 can be made as follows, for example.

First, an insulating layer made of a silicon oxide or the like is formed on the surface of a silicon substrate (wafer) 31 by thermal oxidation or the like, and thereafter a wiring pattern 32 which is integral with pad electrodes is formed on a first surface (a lower side in the example of FIG. 9A: the surface on which a semiconductor element is mounted in FIG. 1) of the silicon substrate 31. The wiring pattern (pads) 32 is formed by copper (Cu) sputtering, copper (Cu) plating, or the like, and as the patterning technique, the photolithography is used. Further, on the surface on which the wiring pattern (pads) 32 is formed, a passivation film 33 for protecting that surface is formed. The passivation film 33 is made of silicon nitride, phosphorus glass, a polyimide resin, or the like and is formed in such a way that the parts of the pads 32 are exposed. Although the surfaces of the passivation film 33 and pads 32 constitute the identical surface in the example of FIG. 9A, it is not limited to this configuration, as a matter of course, and can be changed appropriately if necessary.

Next, the silicon substrate 31 is thinned by grinding the silicon substrate 31 from a second surface thereof (an upper side in the example of FIG. 9A: the opposite surface of the silicon substrate 31 to the first surface thereof) down to a predetermined thickness (e.g. approximately 100 μm). Thereafter, through-holes extending from the second surface toward the wiring pattern (pads) 32 are formed. The through-holes are formed by anisotropic dry etching using a laser, for example. After the through-holes are formed, an insulating layer made of silicon oxide or the like is formed on the inner wall of each through-hole and the second surface of the silicon substrate 31 by thermal oxidation or the like.

Further, vias 34 are formed by filling the inside of each through-hole with a conductive material. Thereafter, a wiring pattern 35 which is integral with pad electrodes is formed on the other surface of the silicon substrate (wafer) 31. The vias 34 and the wiring pattern (pads) 35 are formed by copper (Cu) sputtering, copper (Cu) plating, or the like, and as the patterning technique, the photolithography is used. Further, the surface of the wiring pattern (pads) 35 is roughened to an uneven state by etching or the like. Making the surface of each pad 35 uneven as described above can increase the adhesion with the resin layer to be formed on the pad 35.

Thereafter, the silicon substrate (wafer) 31 is diced, whereby separated individual interposers 30 can be obtained. Here, the side surface of each interposer 30 is uneven due to the cutting with the blade of the dicer. Accordingly, in addition to the unevenness of the surface of the pad 35, the unevenness of the side surface of the interposer 30 can further increase the adhesion with the resin layer to be in contact with the periphery of the interposer 30.

As depicted in FIG. 9B, the interposer 30 made as described above is mounted on the convex portion (plating film MP) of the support base material BS1, in a state that an insulating adhesive layer 37 (e.g. a sheet member made of an epoxy-based resin or the like) intervenes on the surface of the interposer 30 on which the passivation film 33 is formed (the first surface of the interposer 30). The insulating adhesive layer 37 functions to protect the interposer 30, together with the passivation film 33, such that the interposer 30 is not dissolved by the etchant when the support base material (Cu) BS1 is etched in the final step.

Referring back to FIGS. 5A to 5D, in the next step (see FIG. 5B), on the support base material BS1 on which the interposer 30 is mounted, an insulating layer 12 having a thickness of approximately 30 μm is formed in such a way as to cover the interposer 30 and the pads P1 therearound. As the material of the insulating layer 12, an organic resin such as a thermosetting epoxy-based resin or a thermosetting polyimide-based resin is used. As one method of formation, for example, the insulating layer 12 can be formed by laminating an epoxy-based resin film on the support base material BS1 and then curing this resin film by subjecting the resin film to heat treatment at a temperature of from 130 to 150° C., while pressing the resin film.

In the next step (see FIG. 5C), by applying the boring processing to the desired positions of the insulating layer 12 (parts corresponding to the respective positions of the pads 35 on the interposer 30 and the pad P1 on the support base material BS1) by means of a carbon dioxide laser, an excimer laser, or the like, via holes VH1 and VH2 reaching the pads 35 and P1 on the interposer 30 and support base material BS1 are formed. Although the via holes VH1 and VH2 are formed by using a laser in this example, in a case that the insulating layer 12 is formed by using a photosensitive resin, it is possible to form desired via holes by using a photolithography technique.

In the next step (see FIG. 5D), on the insulating layer 12 in which the via holes VH1 and VH2 are formed, wiring layers 13 having a desired pattern are formed by using a semi-additive method or an additive method or the like. The wiring layers 13 are connected to the underlying pad 35 and the pad P1 respectively through the vias 13a which are formed to bury the via hole VH1 and the via hole VH2.

Specifically, first, a copper (Cu) seed layer (unillustrated) is formed on the insulating layer 12 including the inside of each of the via holes VH1 and VH2 by non-electrolytic plating, sputtering, or the like. Thereafter, a resist film (unillustrated) having opening portions according to the pattern of the wiring layer 13 to be formed is formed. Next, the wiring layer 13 (including the vias 13a) having a thickness ranging from approximately 5 μm to 10 μm is formed on parts of the seed layer (Cu) exposed from the opening portions in the resist film by electrolytic Cu plating utilizing the seed layer as a power supply layer. Thereafter, like the process performed in the step of FIG. 3E, the resist film is removed, and further the exposed seed layer is removed by wet etching.

Note that, when the Cu seed layer is removed, an upper part of the wiring layer (Cu) 13 is removed together. However, since the wiring layer 13 is much thicker than the seed layer, a problem such as the disconnection of the wiring layer 13 will not occur.

Figure 5A:
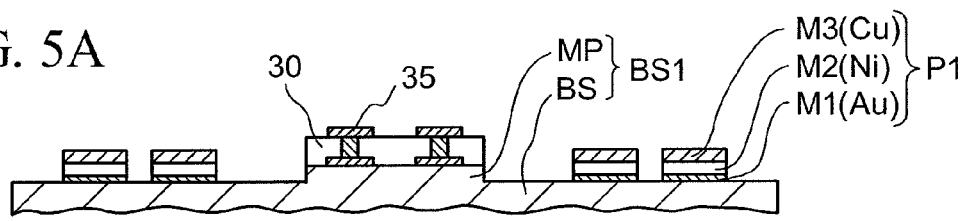
FIGS. 5A to 5D are cross-sectional views depicting manufacturing steps (No. 3) subsequent to the steps of FIGS. 4A to 4D.
Figure 5B:
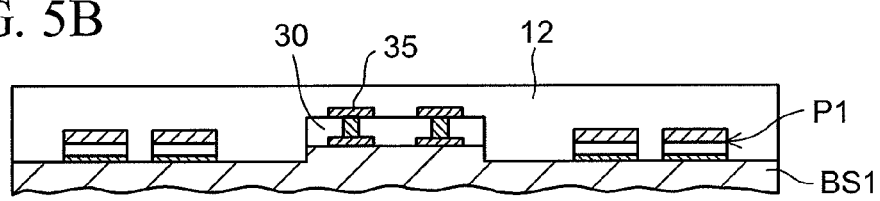
Figure 5C:
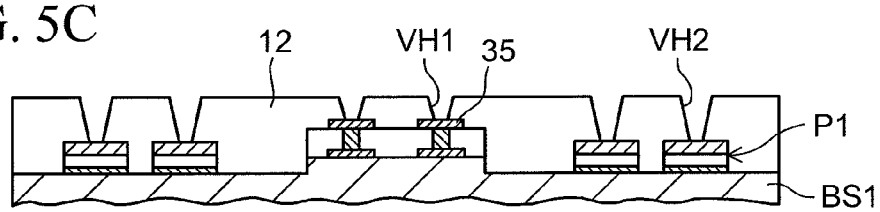
Figure 5D:
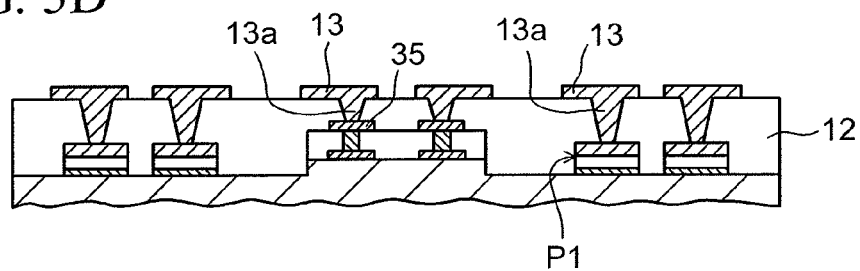

In the next step (see FIG. 6A), like the processes performed in the steps of FIGS. 5B to 5D, insulating layers and wiring layers are alternately stacked until reaching a desired number of layers. In this embodiment, two layers of insulating layers 14 and 16, and two layers of wiring layers 15 and 17 are stacked. First, the insulating layer 14 is formed on the insulating layer 12 and the wiring layer 13. Then, via holes reaching pad portions defined in desired positions of the wiring layer 13 are formed in the insulating layer 14. Thereafter, the wiring layer 15 which is filled in the via holes (forming vias 15a) and is connected to the pads is formed with a desired pattern. Further, the insulating layer 16 is formed on the insulating layer 14 and the wiring layer 15. Then, via holes reaching pad portions defined in desired positions of the wiring layer 15 are formed in the insulating layer 16. Thereafter, the wiring layer 17 which is filled in the via holes (forming vias 17a) and is connected to the pads is formed with a desired pattern.

In the next step (see FIG. 6B), like the process performed in the step of FIG. 5B, on the insulating layer 16 and the wiring layer 17 which are exposed, an insulating layer 18 having a thickness of approximately 15 μm is formed such that the wiring layer 17 is covered.

In the next step (see FIG. 6C), on the insulating layer 18, a sheet-shaped member 40 is stacked which is made of a material having an elastic modulus (larger than 130 GPa but not larger than 500 GPa) and a CTE (not larger than 10 ppm/K) which are within the predetermined ranges described above. As the sheet-shaped member 40, a metallic material such as a 42 alloy, Kovar, or a 36 alloy, a non-metallic material such as a ceramic material, silica glass, silicon, or a carbon fiber cloth, or the like is preferably used.

The sheet-shaped member 40 is stacked basically by bonding it to the insulating layer 18 (such as an epoxy-based resin film or the like) by thermocompression bonding (heating and pressurizing). For example, when the insulating layer 18 is heated and pressurized to be cured, the sheet-shaped member 40 is subjected to thermocompression bonding at the same time to be bonded to and stacked on the insulating layer 18. In this respect, in order to increase the adhesion to the underlying insulating layer 18, the surface of the sheet-shaped member 40 may be made rough (uneven) prior to the heating and pressurizing. Exemplary steps of this roughening will be described with reference to FIGS. 10A to 11C by taking an example where a metal plate of a 42 alloy is used as the sheet-shaped member 40.

Figure 10A:
FIGS. 10A to 10C are cross-sectional views depicting an example of processing steps to provide a supplemental explanation of the process performed in the step of FIG. 6C.
Figure 10B:
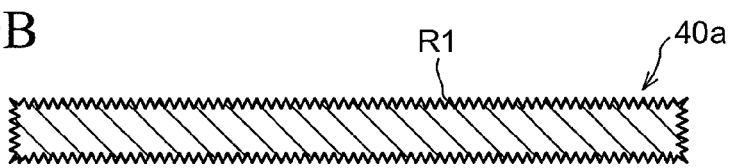
Figure 10C:
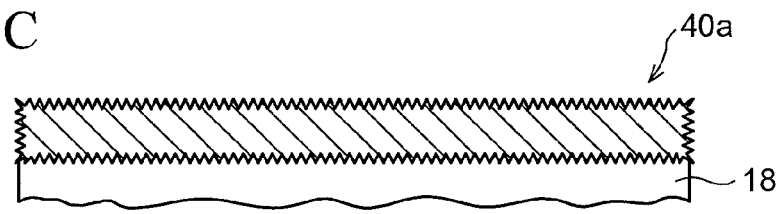
Figure 11A:
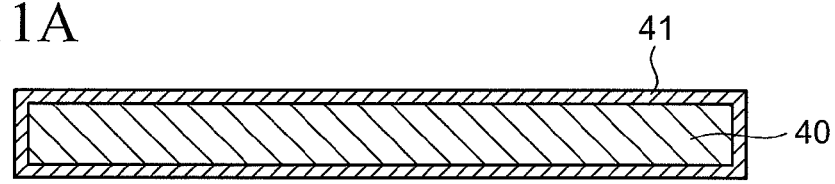
FIGS. 11A to 11C are cross-sectional views depicting another example of processing steps to provide a supplemental explanation of the process performed in the step of FIG. 6C.
Figure 11B:
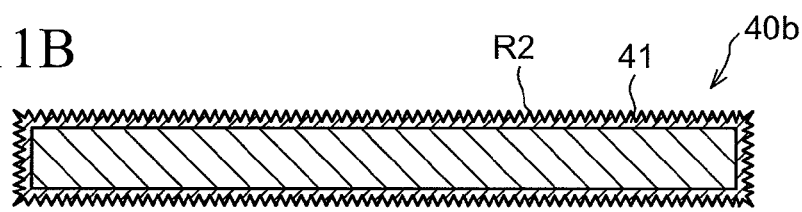
Figure 11C:
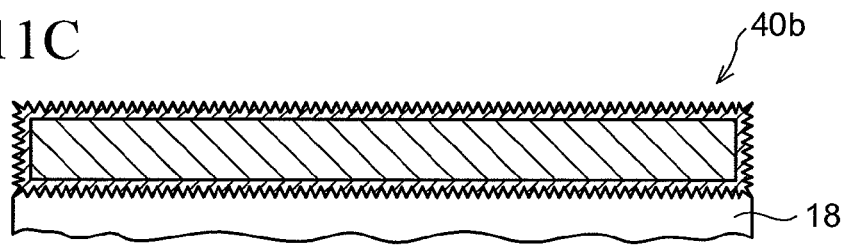
Figure 12A:
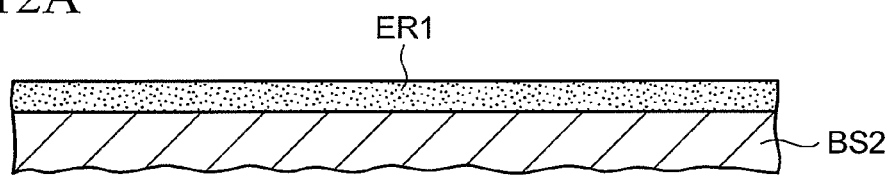
FIGS. 12A to 12D are cross-sectional views depicting another example of the steps for manufacturing the wiring substrate in FIG. 1 (only steps corresponding to the processes performed in the steps of FIGS. 3A to 3E)
Figure 12B:
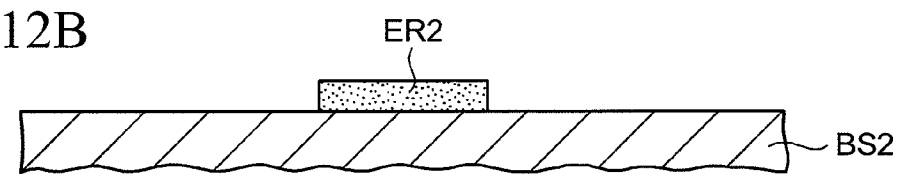
Figure 12C:
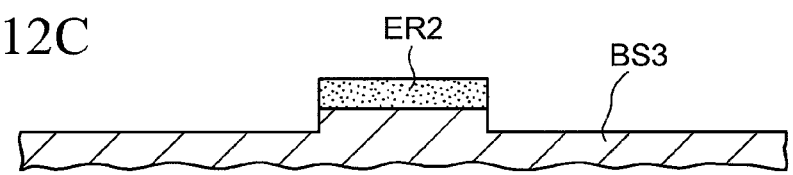
Figure 12D:

In the method depicted in FIGS. 10A to 10C, on a metal plate (sheet-shaped member 40) of a 42 alloy having a desired thickness (FIG. 10A), uneven portions R1 are formed by roughening the surface thereof by etching or the like (FIG. 10B). Then, the metal plate (sheet-shaped member 40a) on which the uneven portion R1 is formed is stacked on the insulating layer 18, and they are adhered to each other by thermocompression bonding (FIG. 10C). On the other hand, in the method depicted in FIGS. 11A to 11C, a plating film 41 is formed on the surface of a metal plate (sheet-shaped member 40) made of a 42 alloy having a desired thickness by performing Cu plating thereon (FIG. 11A). Then, the uneven portions R2 are formed on the surface of the plating film 41 by roughening the surface thereof by etching or the like (FIG. 11B). Thereafter, the metal plate (sheet-shaped member 40b) on which the uneven portions R2 is formed is stacked on the insulating layer 18, and they are adhered to each other by thermocompression bonding (FIG. 11C).

In the next step (see FIG. 7A), opening portions OP3 are formed in desired parts in the sheet-shaped member 40 (e.g. a metal plate of a 42 alloy). The size of each opening portion OP3 is selected to be larger than the opening size (largest value) of the via holes VH3 to be formed in a subsequent step.

The opening portions OP3 can be formed by using a subtractive method. First, a resist layer (etching resist ER) patterned in the shapes of the opening portions OP3 to be formed is formed on the sheet-shaped member 40. Next, while using the etching resist ER as a mask, the exposed parts of the sheet-shaped member 40 are removed by wet etching (the formation of opening portion OP3). Then, the etching resist ER is removed.

Figure 6A:
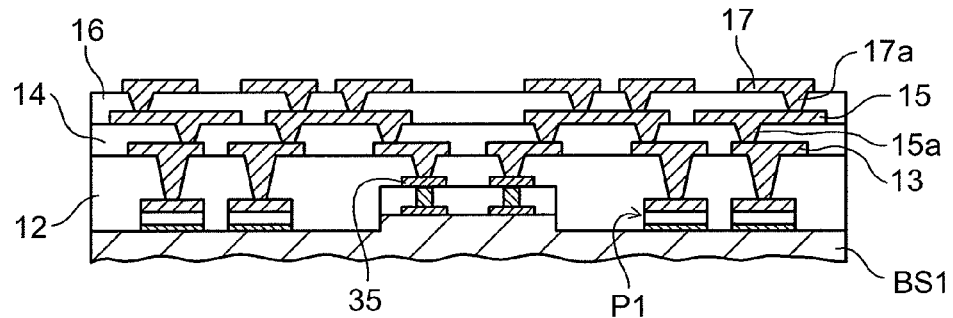
FIGS. 6A to 6C are cross-sectional views depicting manufacturing steps (No. 4) subsequent to the steps of FIGS. 5A to 5D.
Figure 6B:
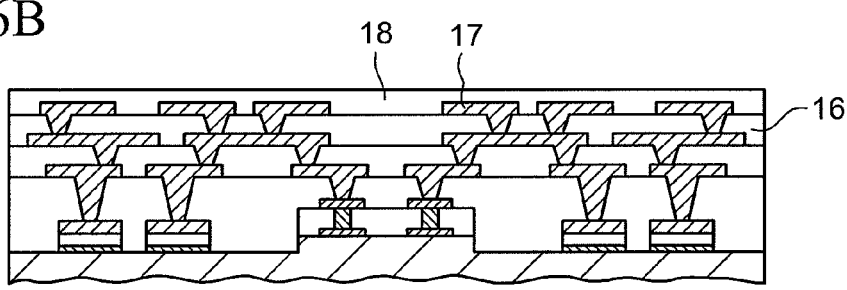

In the next step (see FIG. 7B), like the process performed in the step of FIG. 6B, an insulating layer 20 is formed on the insulating layer 18 and the sheet-shaped member 40 which are exposed such that the opening portions OP3 (FIG. 7A) of the sheet-shaped member 40 are filled. The insulating layer 20 is selected such that the thicknesses of the part on the sheet-shaped member 40 are approximately 15 µm.

In the next step (see FIG. 7C), like the process performed in the step of FIG. 5C, by applying the boring processing to the desired positions of the insulating layer 20 (parts corresponding to the respective positions where the opening portion OP3 (FIG. 7A) of the sheet-shaped member 40 is formed) by means of a carbon dioxide laser, an excimer laser, or the like, via holes VH3 reaching the underlying wiring layer 17 (pad portion) are formed. In this step, the opening size (largest value) of the via hole VH3 is selected to be smaller than the opening portion OP3 of the sheet-shaped member 40. Therefore, it does not occur that the insulating layers 18 and 20 are exposed to the inner circumferential surfaces of the via holes VH3, and the side surfaces of the sheet-shaped member 40 are exposed.

In the next step (see FIG. 8A), like the process performed in the step of FIG. 5D, on the insulating layers 18 and 20 in which the via holes VH3 (FIG. 7C) are formed, a wiring layer 21 having a desired pattern is formed by a semi-additive method or the like. The wiring layers 21 are connected to the underlying wiring layer 17 respectively through the vias 21a which are formed to bury the via holes VH3. The wiring layer 21 constitutes the outermost layers of the package (wiring substrate 10), and the pads P2 are defined in desired parts of the wiring layer 21.

Figure 8A:
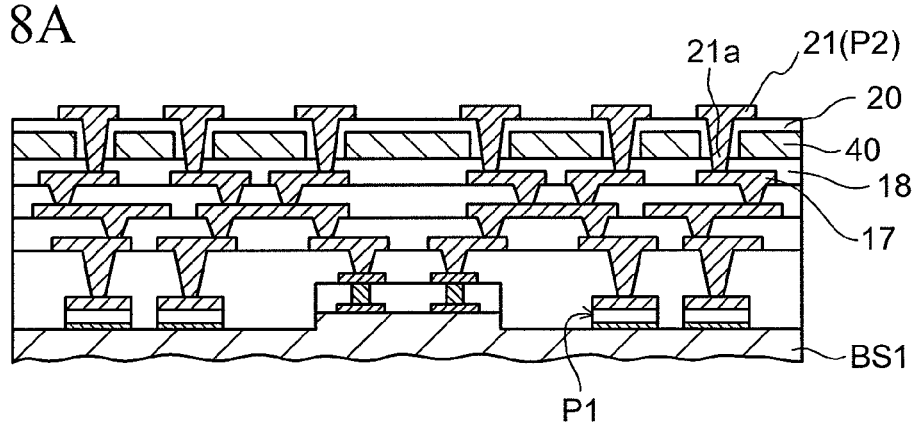
FIGS. 8A to 8C are cross-sectional views depicting manufacturing steps (No. 6) subsequent to the steps of FIGS. 7A to 7C.

Here, the sheet-shaped member 40 is buried in a layer (the insulating layer 20 in the illustrated example) having a small wiring formation density in the wiring substrate 10. For this reason, even when the sheet-shaped member 40 is buried in the insulating layer 20 over substantially the entire surface thereof (including the region between the adjacent wirings (vias 21a)), the wirings can be formed while maintaining the insulation between the sheet-shaped member 40 and the vias 21a. Specifically, as depicted in FIG. 8A, the outermost wiring layer 21 (vias 21a) can penetrate the two layers of the insulating layers 18 and 20 and be electrically connected to the underlying wiring layer 17.

In the next step (see FIG. 8B), on the surface on which the wiring layer 21 (pads P2) is formed, a solder resist layer 22 having a thickness of from approximately 30 µm to 40 µm is formed such that the part of the pads P2 is exposed, and the surface (on the insulating layer 20 and the wiring layer 21) is covered. The solder resist layer 22 is made of a photosensitive epoxy acrylic resin, for example, and can be formed by coating this resin resist (or laminating one molded in a film form) and patterning the resist in a desired shape. By this patterning, the opening portions having a diameter of approximately 250 µm are formed in the solder resist layer 22, and the pads P2 of the wiring layer 21 are exposed from the opening portions. Further, a suitable surface treatment (such as Ni/Au plating) is performed on the top of each exposed pad P2.

In the final step (see FIG. 8C), the support base material BS1 used as a temporary substrate is removed. By wet etching using an alkaline solution such as an aqueous ferric chloride solution, an aqueous copper chloride solution, or an aqueous ammonium persulfate solution, for example, the support base material (Cu) BS1 can be etched and removed selectively with respect to the exposed pads P1 and P2 (each having an Au plating layer formed at its outer surface), the insulating layer 12, the insulating adhesive layer 37 (FIG. 9B) on the interposer 30, and the solder resist layer 22.

Further, the insulating adhesive layer 37 (FIG. 9B) on the interposer 30 is peeled and removed, and thereafter, solders 23 and 24 (FIG. 1) of adequate amounts are deposited on the pads 32 (FIG. 9A) on the interposer 30 and the pads P1 (FIG. 1) on the insulating layer 12, which are exposed. Then, the whole structure is cut and divided into individual packages by means of a dicer or the like, whereby the wiring substrate 10 of this embodiment is obtained.

In the manufacturing method described above, the convex support base material BS1 is formed by plating (electrolytic Cu plating) in the steps of FIGS. 3A to 3E. However, the formation is not necessarily limited to this method, as a matter of course. In an alternative method, a desired convex support base material can be formed by half etching, for example. FIGS. 12A to 12D depict an example of manufacturing steps of that case.

First of all, in the first step (see FIG. 12A), like the process performed in the step of FIG. 3A, a copper (Cu) support base material BS2 is prepared, and an etching resist (resist layer) ER1 is formed on the support base material BS2 by using a patterning material. As the support base material BS2 prepared here, one slightly thicker than the support base material BS used in the step of FIG. 3A is used. Moreover, as the patterning material, a photosensitive dry film, a liquid photoresist, or the like can be used.

In the next step (see FIG. 12B), like the process performed in the step of FIG. 3C, the etching resist (resist layer) ER1 is patterned in a desired shape. In this case, the patterning is performed such that only a part ER2 is left from the etching resist ER1, the part ER2 which corresponds to the external form (e.g. rectangular shape) of the interposer 30 to be mounted inside the concave portion CP (FIG. 1), when viewing the interposer 30 with the planer view.

In the next step (see FIG. 12C), with the etching resist ER2 as a mask, the exposed part of the support base material BS2 is subjected to half etching. By wet etching using an alkaline solution such as an aqueous ferric chloride solution or an aqueous copper chloride solution, for example, the exposed part of the support base material (Cu) BS2 is removed to a desired depth. The desired depth of the removal corresponds to the thickness of the plating film (Cu) MP formed in the step of FIG. 3D.

In the next step (see FIG. 12D), like the process performed in the step of FIG. 3E, the resist layer ER2 used as an etching resist is removed. As a result, a support base material BS3 having a desired convex shape is obtained. The support base material BS3 is the same in shape as the convex support base material BS1 formed in the step of FIG. 3E. The subsequent processes are the same as the process of FIG. 4A and those subsequent thereto.

Figure 6C:
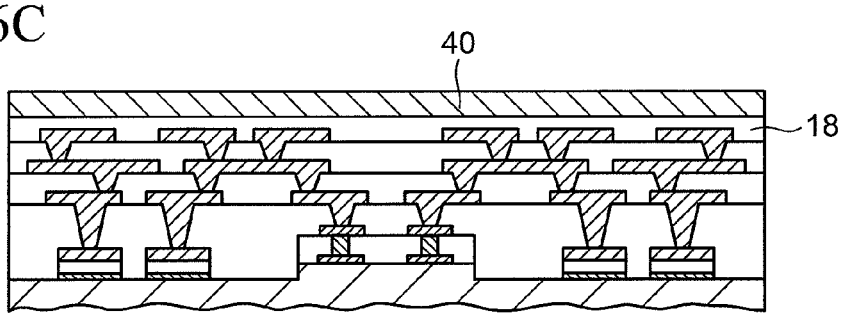
Figure 7A:
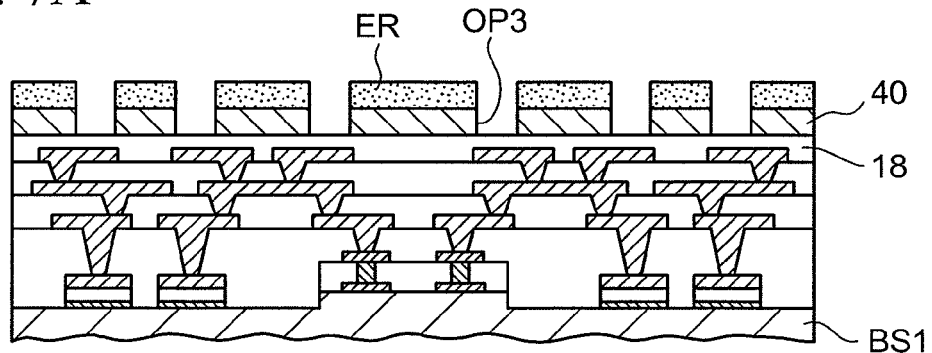
FIGS. 7A to 7C are cross-sectional views depicting manufacturing steps (No. 5) subsequent to the steps of FIGS. 6A to 6C.
Figure 7B:
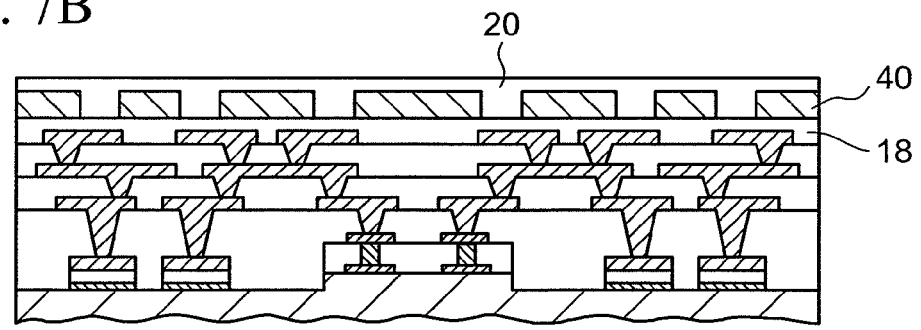
Figure 7C:
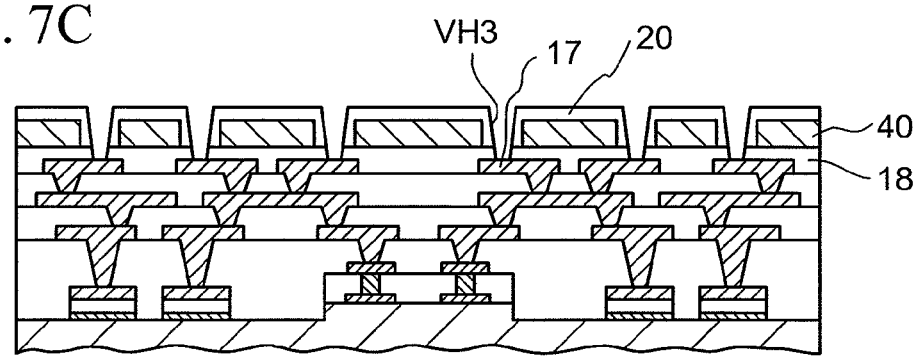

Meanwhile, as the material of the sheet-shaped member 40 stacked on the insulating layer 18 in the step of FIG. 6C, it is possible to use a material which is appropriately selected from among materials having elastic moduli (larger than 130 GPa but not larger than 500 GPa) and CTEs (not larger than 10 ppm/K) which are within the predetermined ranges described above. For example, in a case of using a metallic material (42 alloy or the like) for the sheet-shaped member 40, the sidewall portion 40S of the sheet-shaped member 40 may not be exposed at the side surface of the wiring substrate 10b (see FIG. 18) as mentioned above. In this case, patterning should be performed using a known technique in such a way that the sheet-shaped member (metal portion) is not formed at cutting parts when the whole wiring substrate is cut into individual wiring substrate, for example.

Moreover, in a case of using a non-metallic material (e.g. a carbon fiber cloth) for the sheet-shaped member 40, like the case of the prepreg, one (sheet-shaped member) obtained by impregnating a carbon fiber cloth with a B-stage resin material in advance is stacked on the insulating layer 18. In this case, instead of the method used in the step of FIG. 7A, desired opening portions OP3 are formed in the sheet-shaped member 40 made of the non-metallic material by use of a carbon dioxide laser or the like.

As described above, in the wiring substrate 10 and the manufacturing method thereof according to this embodiment, the interposer 30 (e.g. a silicon interposer), whose base material is a material having a coefficient of thermal expansion close to that of the base material (silicon) of a semiconductor element to be mounted thereon, is buried in a center part of the outermost insulating layer 12 at the first surface side of the wiring substrate 10. On the other hand, the sheet-shaped member 40, which is made of a material having a relatively large elastic modulus and a relatively small CTE that are within the predetermined ranges described above, is buried in the outermost insulating layer 20 at the second surface side of the wiring substrate 10. Specifically, there is obtained a wiring substrate 10 in which the interposer 30 and the sheet-shaped member 40 are disposed at positions that are symmetrical with each other in the vertical direction (the direction perpendicular to the substrate surface).

As described, while the wiring substrate 10 of this embodiment is in the form of a coreless substrate which can be adapted to reduction in thickness, the wiring substrate 10 has a structure reinforcing the whole wiring substrate 10 (semiconductor device 50) due to the presence of the sheet-shaped member 40 buried in a specific position inside the wring substrate 10. In other words, the rigidity of the substrate (the whole of the device) is increased.

Accordingly, even when it is under a room-temperature (around 25° C.) condition, further some other temperature condition where heat (around 230 to 260° C.) is applied due to reflow in connecting terminals, when the semiconductor element 51 is mounted on the wiring substrate 10 (FIG. 2), or the wiring substrate having the mounted the semiconductor element (the semiconductor device 50 in FIG. 2) is mounted on a motherboard or the like (when secondary mounting is performed), the sheet-shaped member 40 functions to make the vertical distribution of each of the elastic modulus and the coefficient of thermal expansion (CTE) substantially symmetrical in cooperation with the interposer 30. As a result, it can cope with the occurrence of warpage in the whole of the substrate sufficiently. Particularly, since the sheet-shaped member 40 is buried in the insulating layer 20 over substantially the entire surface thereof, even when warpage occurs, the level of the warpage can be alleviated (the amount of the warpage can be reduced) sufficiently.

Moreover, in the outermost insulating layer 12 at the first surface side of the wiring substrate 10, the pads P1 (first external connection pads) are provided at a part around the interposer 30. Thus, the pads P1 can be effectively utilized for mounting passive elements (chip capacitors 55 or the like) or, when necessary, for providing POP connection to another wiring substrate or the like (e.g. the wiring substrate 62 illustrated in FIG. 14). This leads to a further improvement in the functionalities (performances) of semiconductor devices, and it contributes to further expansion of the field of application as semiconductor devices.

Incidentally, in the substrate structure (FIG. 3, etc.) disclosed in Patent Document 1 (Japanese Laid-open Patent Publication No. 2009-130104) mentioned above, the warpage of the substrate is suppressed by providing an reinforcing material (stiffener) made of a mold resin at a part around an interposer arranged at a center part on the substrate. However, this structure has a disadvantage that the terminals (pads) for external connection cannot be provided at the part around the interposer. In contrast, in the configuration of the wiring substrate 10 of this embodiment, the pads P1 for external connection can be provided at the part around the interposer 30.

Moreover, in the wiring substrate 10 of this embodiment, the interposer 30 is buried in the outermost insulating layer 12 at the first surface side of the wiring substrate 10, and the semiconductor element 51 is mounted on the wiring substrate 10 in a state that the interposer 30 intervenes therebetween. Thus, it is possible to achieve finer wirings than conventional packages formed of a simple wiring substrate using only an organic resin as its base material. It is also possible to reduce the cost more than packages formed of a simple silicon interposer. Furthermore, since the interposer 30 is buried in the outermost insulating layer 12, the wiring substrate can be made thinner than conventional wiring substrate in which an interposer is stacked on the wiring substrate, thus it is possible to achieve a smaller semiconductor device.

Moreover, the semiconductor element 51 mounted on the wiring substrate 10 (interposer 30) of this embodiment can be prevented from being damaged. Specifically, in conventional wiring substrate structures, the amount of warpage (displacement) is larger in an outside area from the semiconductor element mounting area than the semiconductor element mounting area on the wiring substrate. By this matter, a stress due to an influence of such a difference of the warpage causes a crack or the like in the semiconductor element. Particularly, in a case of a semiconductor element using a low-k material (low dielectric constant material) as its interlayer insulating layer for the purpose of increasing the processing speed (the speed of signal propagation between wiring layers), the above-described trouble occurs more significantly because the elastic modulus of low-k materials is low in general (it is fragile in strength). In contrast, in this embodiment, the rigidity of the substrate (the whole of the device) is increased by the presence of the sheet-shaped member 40, thus it is possible to avoid troubles such as damaging the semiconductor element 51.

(Second Embodiment . . . See FIGS. 13 to 17C)

Figure 13:
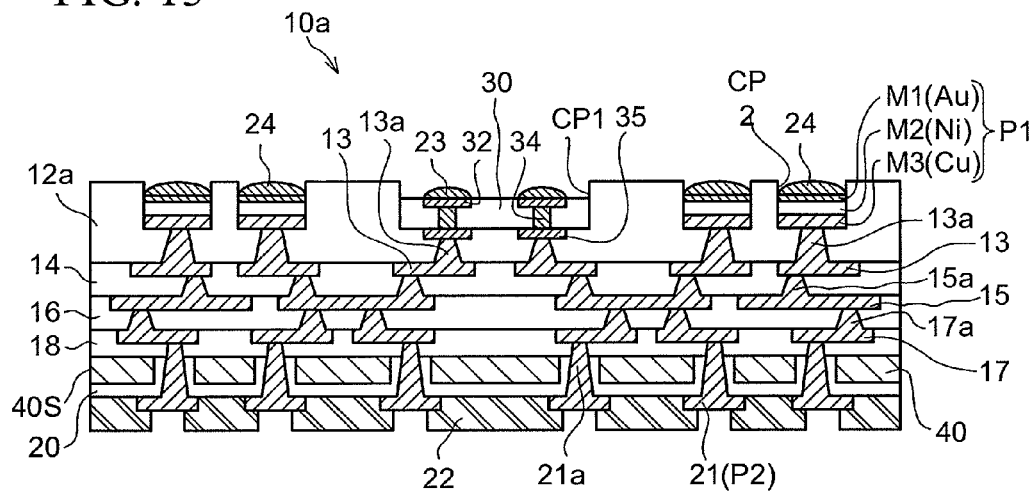
FIG. 13 is a cross-sectional view depicting the configuration of a wiring substrate (semiconductor package) according to a second embodiment.

FIG. 13 depicts the configuration of a wiring substrate (semiconductor package) according to a second embodiment in cross section.

The wiring substrate 10a according to the second embodiment differs from the wiring substrate (FIG. 1) of the foregoing first embodiment with below content. That is, in a first surface side of the wiring substrate 10a, the surface (Au layer M1 side) of the exposed side in the pad P1 (first external connection pad) arranged in an outermost insulating layer 12a is located at a position retrogressing toward the inside of the substrate from the surface of the insulating layer 12a. Specifically, in the outermost insulating layer 12a, concave portions CP2 (second concave portions) are provided with the same deep as the concave portion CP1, in the area around a concave portion CP1 (first concave portion) in which an interposer 30 is buried. The pads P1 are provided inside the concave portion CP2. The other features of the configuration are basically the same as those of the configuration of the wiring substrate 10 according to the first embodiment, and thus description thereof is omitted.

The wiring substrate 10a according to the second embodiment is intended to achieve particularly POP (Package-On-Package) structure.

In one specific form of the POP structure, a semiconductor element is mounted on the lower package, and to pads formed in a area around the semiconductor element, pads formed in a corresponding area of the mounting surface side of the upper package are joined through solder bumps. In such a POP structure, the sizes of the solder bumps (approximately 200 to 300 μm) connecting between the upper and lower packages are usually higher than the height (around 100 μm) of the semiconductor element mounted on the lower package.

Thus, if the surface of the pad arranged in the surrounding region of the lower package is positioned to identical surface with the surface of this package, when the pads of the upper and lower packages are connected to each other, a considerable gap is formed between the position of the surface of the semiconductor element and that of the mounting surface of the upper package. Such a structure causes no problem in the operation of the semiconductor device, yet there is a room for improvement in view of the current trend of reduction in size and thickness and improvement in functionality.

In this respect, in the wiring substrate 10a of the second embodiment, the surface of each pad P1 (first external connection pad) used as a terminal for POP connection retrogresses toward the inside of the wiring substrate 10a from the surface of the substrate at the first surface side (the surface of the outermost insulating layer 12a). In this way, the gap between the mounted semiconductor element and the other wiring substrate is minimized as much as possible, thereby the reduction in size and thickness can be achieved.

Figure 14:
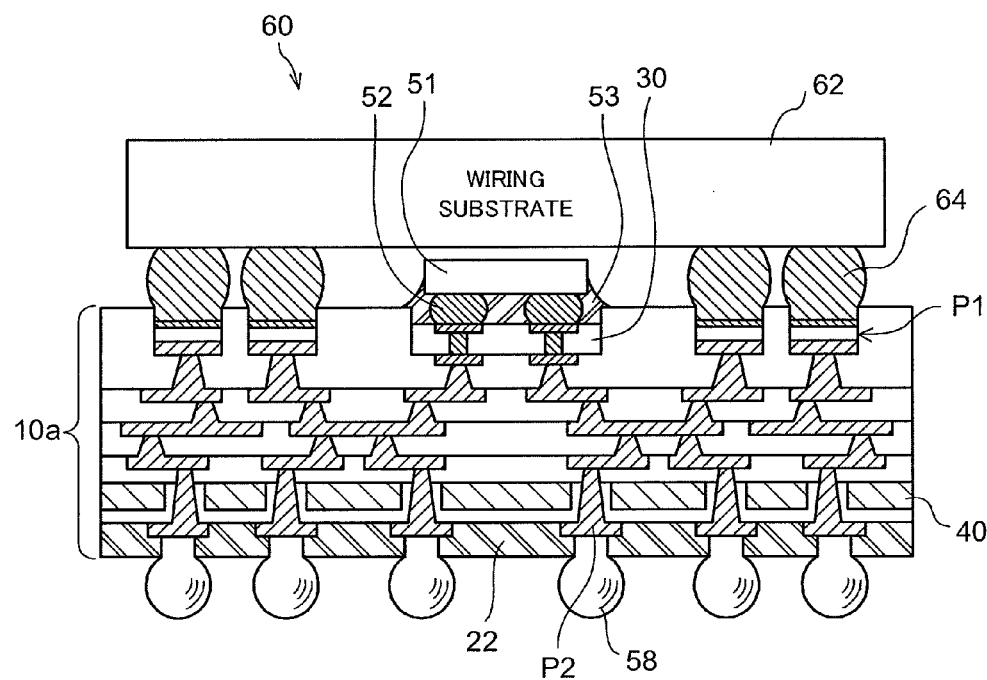
FIG. 14 is a cross-sectional view depicting an exemplary configuration (semiconductor device) in the case of constructing a POP structure by use of the wiring substrate in FIG. 13.
Figure 15A:
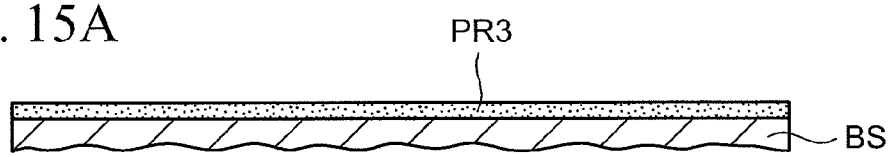
FIGS. 15A to 15D are cross-sectional views depicting an example of steps (No. 1) for manufacturing the wiring substrate in FIG. 13.
Figure 15B:
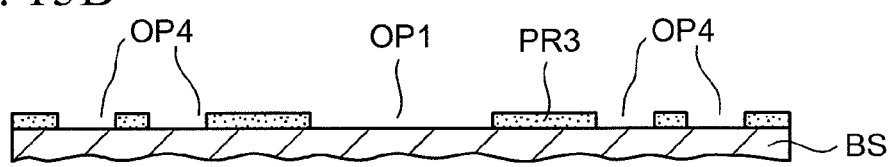
Figure 15C:
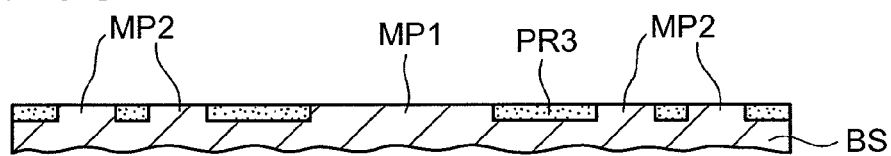
Figure 15D:
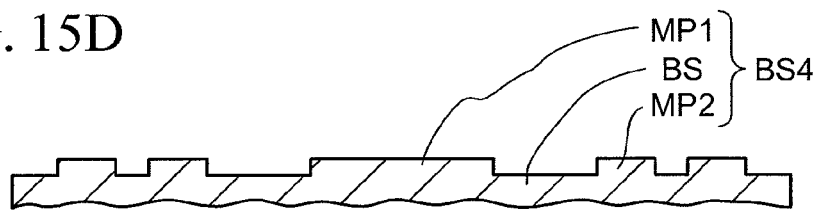
Figure 16A:
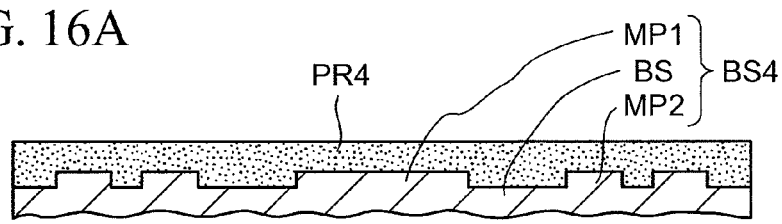
FIGS. 16A to 16D are cross-sectional views depicting manufacturing steps (No. 2) subsequent to the steps of FIGS. 15A to 15D.
Figure 16B:
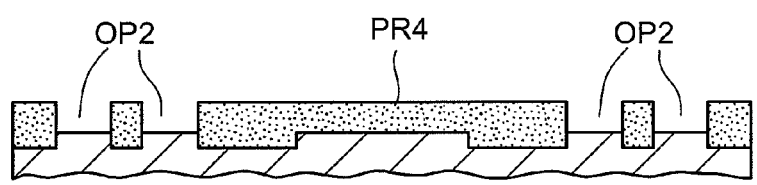
Figure 16C:
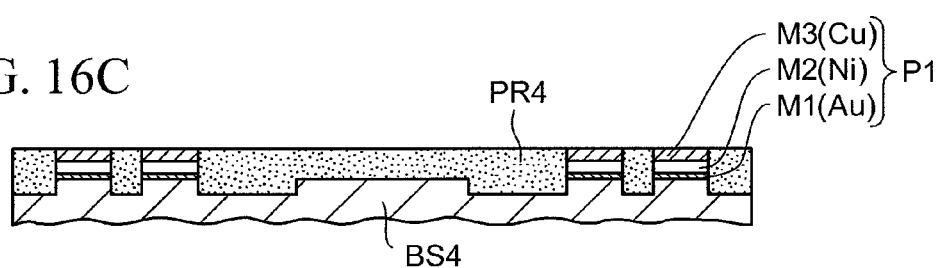
Figure 16D:
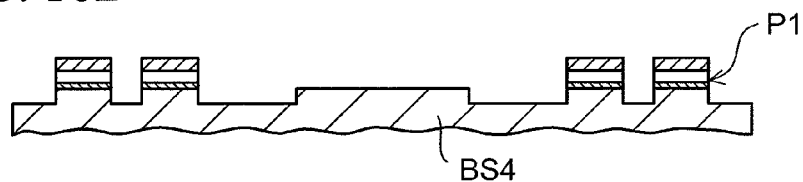
Figure 17A:
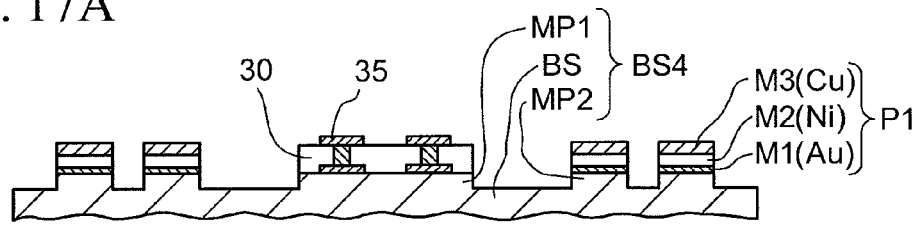
FIGS. 17A to 17C are cross-sectional views depicting manufacturing steps (No. 3) subsequent to the steps of FIGS. 16A to 16D.
Figure 17B:
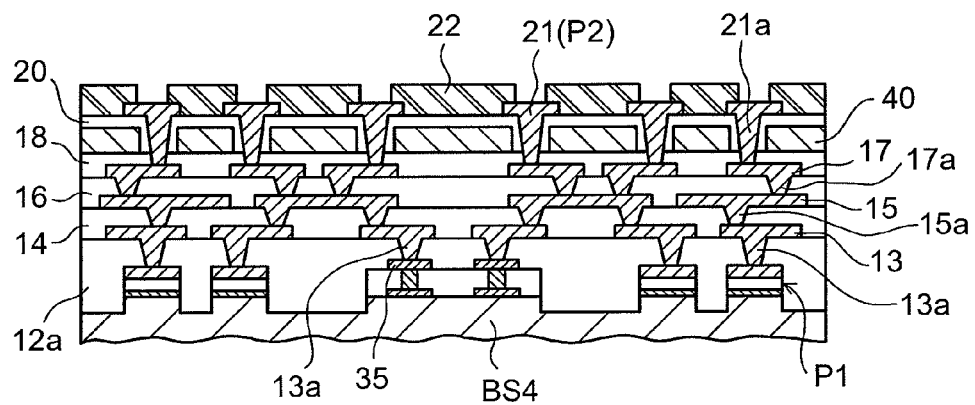
Figure 17C:
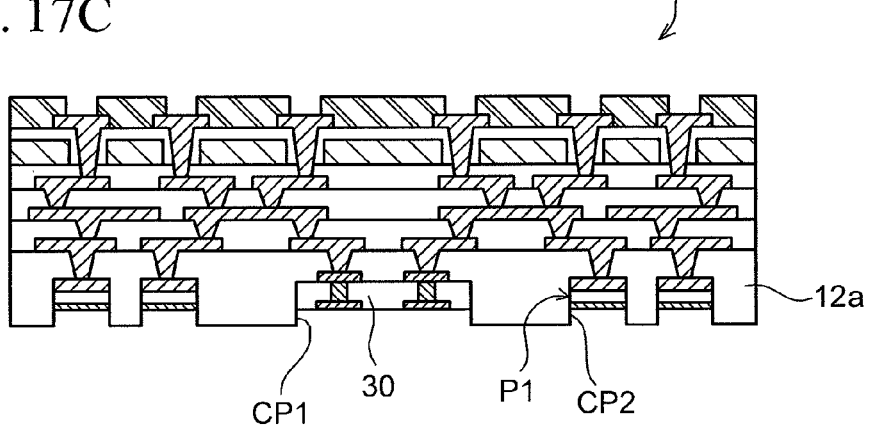
Figure 18:
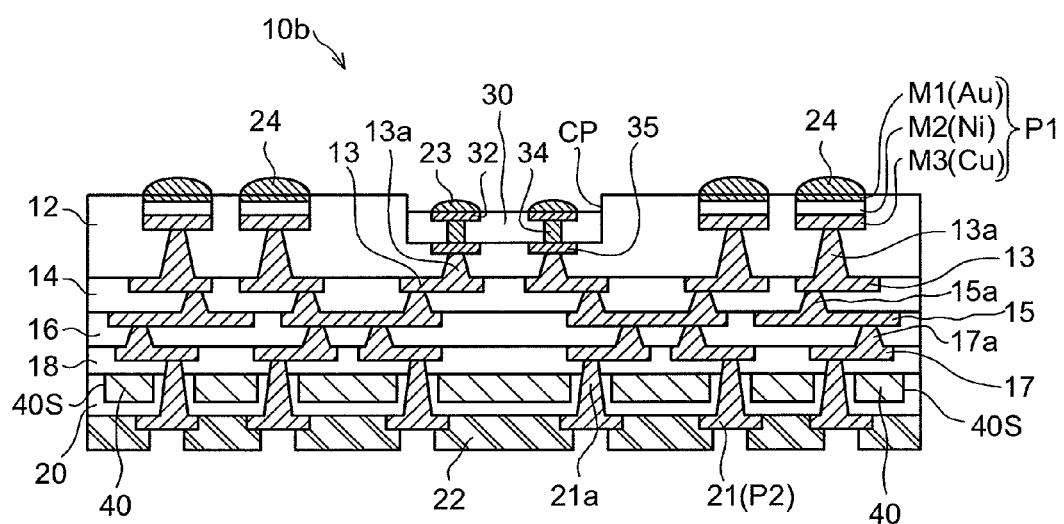
FIG. 18 is a cross-sectional view depicting the configuration of a wiring substrate according a modification of the embodiment in FIG. 1.

FIG. 14 depicts an exemplary configuration (semiconductor device) in cross section obtained by forming a POP structure by use of the wiring substrate 10a of this embodiment.

In the semiconductor device 60 depicted in FIG. 14, a semiconductor element 51 as an active element (e.g. a silicon chip such as a CPU) is mounted on the first surface side of the wiring substrate 10a, and also the other package (wiring substrate 62) is joined to the first surface side of the wiring substrate 10a in a POP structure. Moreover, solder balls 58 as external connection terminals are joined to a second surface side of the wiring substrate 10a (the opposite side of the wiring substrate 10a to the first surface side thereof).

Like the mounting form depicted in FIG. 2, the semiconductor element (chip) 51 is flip-chip mounted on the wiring substrate 10a. Further, an underfill resin 53 is filled in a gap between the mounted chip 51 and the interposer 30 (wiring substrate 10a) and cured, so that the chip 51 is fixed to the wiring substrate 10a.

In the other wiring substrate 62, the electrode pads (unillustrated) formed at its mounting surface side are connected to the corresponding pads P1 on the wiring substrate 10a through solder bumps 64 or the like. When this connection is performed, the surface of each pad P1 retrogresses toward the inside of the wiring substrate 10a from the surface of the substrate, thereby, when the terminals (pads) of the upper and lower wiring substrates 62 and 10a are connected to each other, the gap between the position of the surface (height) of the semiconductor element 51 mounted on the interposer 30 of the lower wiring substrate 10a and that of the mounting surface of the upper wiring substrate 62, can be narrowed relatively. This can cope with the demand for reduction in size and thickness and improvement in functionality of the semiconductor device 60.

Meanwhile, like the structure depicted in FIG. 2, in the second surface side of the wiring substrate 10a, the solder balls 58 as external connection terminals are joined to pads P2 (second external connection pads) exposed from a solder resist layer 22. In this case too, a PGA form may be employed instead of the BGA form, or the pads P2 themselves may be used as external connection terminals.

The wiring substrate 10a according to the second embodiment can be manufactured by basically the same processes as those performed through the steps (FIGS. 3A to 8C) in the manufacturing method according to the first embodiment. However, the manufacturing method differs in the processes of forming parts related to the above-described configuration difference. In the following, a method of manufacturing the wiring substrate 10a of this embodiment will be described with reference to FIGS. 15A to 17C.

First of all, in the first step (see FIG. 15A), like the processes performed in the steps of FIGS. 3A and 3B, a support base material BS made of a copper (Cu) is prepared, and a plating resist (resist layer) PR3 is formed on the support base material BS by using a patterning material.

In the next step (see FIG. 15B), like the process performed in the step of FIG. 3C, the resist layer PR3 is patterned in a desired shape. In this case, the resist layer PR3 is patterned to have an opening portion OP1 which corresponds to the external form (e.g. rectangular shape), in a plan view, of the interposer 30 to be mounted inside the concave portion CP1 (FIG. 13), and opening portions OP4 which correspond to the shapes (e.g. circular shapes) of the pads P1 (concave portions CP2) to be formed around the interposer 30 (concave portion CP1).

In the next step (see FIG. 15C), like the process performed in the step of FIG. 3D, plating films (Cu) MP1 and MP2 having a thickness corresponding to the thickness of the resist layer PR3 are formed on parts of the support base material (Cu) BS exposed from the opening portions OP1 and OP4 in the resist layer PR3 by means of electrolytic Cu plating utilizing the support base material BS as a power supply layer.

In the next step (see FIG. 15D), like the process performed in the step of FIG. 3E, the resist layer PR3 used as a plating resist is removed. As a result, a structure (convex support base material BS4) in which the plating films (Cu) MP1 and MP2 are provided integrally on the support base material (Cu) BS is obtained.

In the next step (see FIG. 16A), like the process performed in the step of FIG. 4A, by using a patterning material (such as a dry film), a plating resist (resist layer) PR4 is formed on the surface of the support base material BS4 at which the convex portions (plating films MP1 and MP2) are formed. The thickness of the resist layer PR4 is selected to the thickness in which at least the convex portion (plating film MP1 and MP2) of the support base material BS4 is covered with the resist layer PR4 and which is equal to the thicknesses of pads P1 to be formed.

In the next step (see FIG. 16B), like the process performed in the step of FIG. 4B, the plating resist (resist layer) PR4 is patterned to have opening portions OP2 which correspond to the shapes (e.g. circular shapes) of the pads P1 to be formed.

In the next step (see FIG. 16C), like the process performed in the step of FIG. 4C, the pads P1 for providing POP connection are formed on parts of the support base material (Cu) BS4 exposed from the opening portions OP2 in the resist layer PR4 by means of electrolytic plating utilizing the support base material BS4 as a power supply layer. Although each of the pads P1 thus formed has a three-layer structure (Au/Ni/Cu) in the illustrated example, the layer configuration is not limited to this layer configuration, as a matter of course, as in the case described above.

Figure 4D:
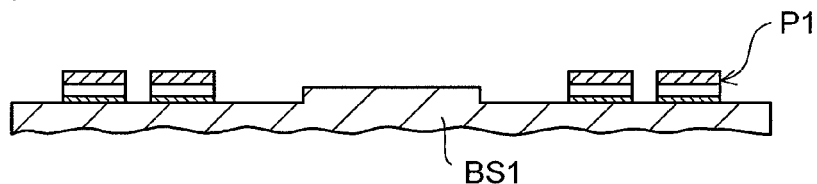

In the next step (see FIG. 16D), like the process performed in the step of FIG. 4D, the resist layer PR4 used as a plating resist is removed. As a result, a structure in which the pads P1 are formed on the surrounding convex portions (plating film MP2) of the support base material BS4 is obtained.

In the next step (see FIG. 17A), like the process performed in the step of FIG. 5A, the interposer 30 made in advance is mounted on the convex portion (plating film MP1) at the center of the support base material BS4. Thereafter, the same processes as the processes performed in the steps of FIGS. 5B to 8A are performed.

Figure 8B:
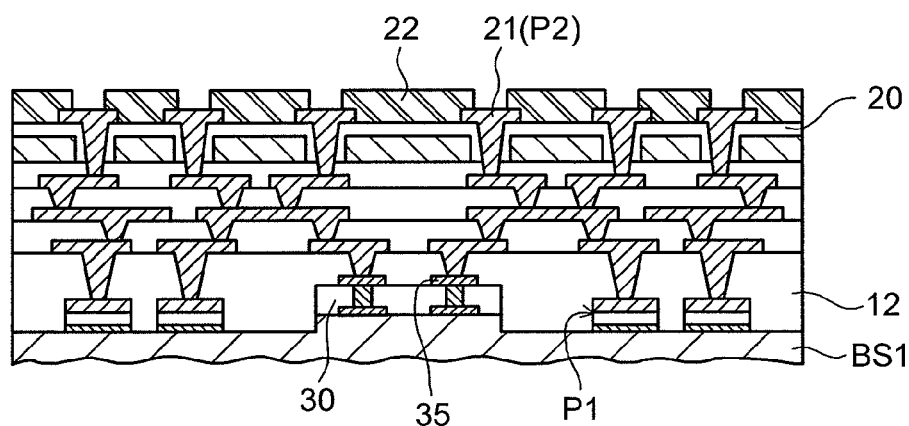

In the next step (see FIG. 17B), like the process performed in the step of FIG. 8B, on the surface at which the wiring layer 21 (pads P2) is formed, a solder resist layer 22 is formed such that the parts of the pads P2 is exposed, and the surface (the insulating layer 20 and the wiring layer 21) is covered. Thereafter, a suitable surface treatment (such as Ni/Au plating) is performed on the top of each exposed pad P2.

Figure 8C:
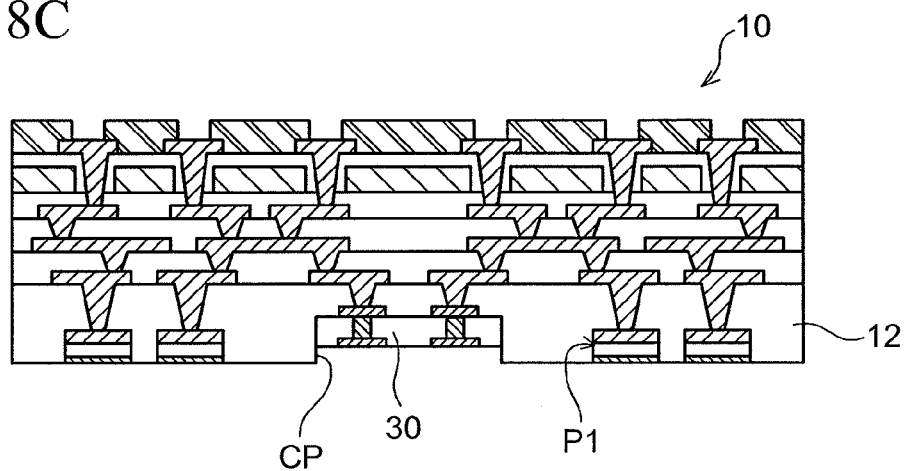

In the final step (see FIG. 17C), like the method used in the step of FIG. 8C, the support base material BS4 used as a temporary substrate is removed. Further, the insulating adhesive layer 37 (FIG. 9B) on the interposer 30 is peeled and removed, and thereafter solders 23 and 24 (FIG. 13) of adequate amounts are deposited on the pads 32 (FIGS. 9A and 9B) on the interposer 30 and the pads P1 on the insulating layer 12a which are exposed. Then, the whole structure is cut and divided into individual packages by means of a dicer or the like, whereby the wiring substrate 10a of this embodiment is obtained.

As described above, the wiring substrate 10a according to the second embodiment has basically the same configuration as the wiring substrate 10 (FIG. 1) according to the first embodiment, except that the pads P1 for POP connection are provided to retrogress toward the inside of the substrate. Accordingly, the second embodiment can bring about the same operation and effect as those of the first embodiment by the presence of the interposer 30 and the sheet-shaped member 40 having high elastic modulus and low CTE, which are disposed at positions that are symmetrical with each other in the vertical direction of the substrate 10a (the direction perpendicular to the substrate surface).

Although preferred embodiments of the present invention are described above in detail, the present invention is not limited to the particular embodiments described above, and various modifications and alterations can be made thereto within the scope of the gist of the invention described in the claims.

For example, in the structure of the wiring substrate 10 depicted in FIG. 8C, in the concave portion CP of the insulating layer 12, the first surface side of the interposer 30 is located at a position retrogressing toward the inside of the substrate from the surface (the pads P1 are exposed to identical surface with that surface) of the insulating layer 12. However, the arrangement of the interposer 30 is not necessarily limited to the illustrated example, as a matter of course. For example, in the manufacturing method described above, in a case that the processes performed in the steps of FIG. 3B to 3E may be omitted, the surface of the interposer 30 at the first surface side and the exposed surfaces of the pads P1 (the surface of the insulating layer 12) can be made to an identical surface (flat) with each other.

Moreover, in each of the embodiments described above, in the first surface side of the wiring substrate 10 (10a), the exposed surfaces of the pads P1 (first external connection pads) arranged in the outermost insulating layer 12 (12a) constitutes the identical surface with the surface of the insulating layer 12. Alternatively, the exposed surface of the pads P1 is located at a position retrogressing toward the inside of the substrate from the surface of the insulating layer 12a. However, the arrangement of the pads P1 is not limited to this, as a matter of course. For example, each pad P1 may be formed such that the exposed surface of the pad P1 constitutes a shape projecting in a convex shape from the surface of the outermost insulating layer 12 (12a). Moreover, the formation position and the existence and non-existence of the solder resist layer 22 can be changed appropriately if necessary.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that various changes, substitutions, and alterations could be made hereto without departing from the spirit and scope of the invention.

What is claimed is:
1. A wiring substrate, comprising:
a structure in which a plurality of wiring layers are stacked through insulating layers intervening therebetween, and which has a first surface side and a second surface side, the first surface side where a semiconductor element is to be mounted, the second surface side being located at an opposite side to the first surface side;

an interposer buried in an outermost one of the insulating layers located at the first surface side, and electrically connected to the semiconductor element to be mounted; and a sheet-shaped member buried in an outermost one of the insulating layers located at the second surface side, wherein, the interposer and the sheet-shaped member are disposed at symmetrical positions each other, the sheet-shaped member has an opening portion penetrating the sheet-shaped member in a thickness direction, and the wiring layer inside the substrate are electrically connected to a second external connection pad through the opening portion, the second external connection pad which is formed on the outermost insulating layer located at the second surface side of the wiring substrate.

2. The wiring substrate according to claim 1, wherein, the interposer is buried in a center part of the outermost insulating layer located at the first surface side of the wiring substrate, and a first external connection pad is provided in a area around the part where the interposer is buried, the first external connection pad which is exposed from the outermost insulating layer located at the first surface side of the wiring substrate.

3. The wiring substrate according to claim 2, wherein the first external connection pad is provided at a position where a surface of the outermost insulating layer located at the first side of the wiring substrate retrogresses in a concave portion shape toward an inside of the substrate.

4. The wiring substrate according to claim 1, wherein, on the first surface side of the interposer, a pad is provided, the pad which is exposed to the first surface side of the wiring substrate and is electrically connected the semiconductor element to be mounted, and on the second surface side of the interposer located at an opposite side to the first surface side thereof, a pad is provided, the pad which is directly connected to a conductive via formed in the outermost insulating layer located a the first surface side of the wiring substrate.

5. The wiring substrate according to claim 1, wherein a sidewall portion of the sheet-shaped member is covered with the outermost insulating layer located at the second surface side of the wiring substrate.

6. A method of manufacturing a wiring substrate, comprising:

mounting an interposer on a support base material;

forming an insulating layer covering the interposer, on the support base materal;

forming a via hole in the insulating layer and forming a wiring layer on the insulating layer, the wiring layer which is electrically connected to the interposer through the via hole;

stacking a insulating layer and a wiring layer alternately;

stacking a sheet-shaped member having an opening portion, on the stacked insulating layer forming an insulating layer covering the sheet-shaped member having the opening portion, thereby burying the sheet-shaped member by the insulating layer;

forming a via hole in the insulating layer burying the sheet-shaped member and the insulating layer located under thereof, according to a position of the opening portion of the sheet-shaped member, and forming an outermost wiring layer electrically connected to the underlying wiring layer through the via hole, on the burying insulating layer; and removing the support base material.

7. The method of manufacturing a wiring substrate according to claim 6, further comprising, before the mounting the interposer on the support base material, forming a first external connection pad on the support base material in an area around a part where the interposer is to be mounted, wherein in the forming the insulating layer on the support base material, the insulating layer is formed on the support base material in such a way as to cover the interposer and the first external connection pad, and in the forming the wiring layer on the insulating layer, a plurality of via holes are formed in the insulating layer, and the wiring layer is formed on the insulating layer, the wiring layer which is electrically connected to the interposer and the first external connection pad respectively through the plurality of via holes.

8. The method of manufacturing a wiring substrate according to claim 6, wherein in the burying the sheet-shaped member by covering the sheet-shaped member with the insulating layer, the insulating layer is formed in suc a way as to cover a sidewall portion of the sheet-shaped member as well.

\* \* \* \* \*